United States Patent
Kim et al.

(10) Patent No.: US 11,283,432 B2
(45) Date of Patent: Mar. 22, 2022

(54) SPREAD SPECTRUM CLOCK GENERATION DEVICE AND METHOD FOR OPERATING SPREAD SPECTRUM CLOCK GENERATION DEVICE

(71) Applicant: MagnaChip Semiconductor, Ltd., Cheongju-si (KR)

(72) Inventors: Dong Ho Kim, Cheongju-si (KR); Gil Sung Roh, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 17/018,175

(22) Filed: Sep. 11, 2020

(65) Prior Publication Data

US 2021/0409011 A1    Dec. 30, 2021

(30) Foreign Application Priority Data

Jan. 9, 2020  (KR) ........................ 10-2020-0003170

(51) Int. Cl.
*H03K 5/01* (2006.01)
*G06F 1/12* (2006.01)
*H03K 5/00* (2006.01)

(52) U.S. Cl.
CPC ................. *H03K 5/01* (2013.01); *G06F 1/12* (2013.01); *H03K 2005/00078* (2013.01)

(58) Field of Classification Search
CPC ... H03K 5/01; H03K 2005/00078; G06F 1/12
USPC .......................................................... 327/299
See application file for complete search history.

(56) References Cited

U.S. PATENT DOCUMENTS

| | | | | |
|---|---|---|---|---|
| 5,917,850 | A * | 6/1999 | Fujita | H04B 1/7075 375/150 |
| 6,407,606 | B1 * | 6/2002 | Miura | G06F 1/06 327/241 |
| 6,643,317 | B1 * | 11/2003 | Blumer | H04B 15/04 327/299 |
| 7,508,278 | B2 | 3/2009 | Chen | |
| 2007/0217481 | A1 * | 9/2007 | Ko | H03K 5/133 375/130 |
| 2009/0323768 | A1 * | 12/2009 | Chan | H04B 15/04 375/130 |
| 2017/0338941 | A1 * | 11/2017 | Yang | H03K 5/1252 |

* cited by examiner

*Primary Examiner* — Ryan Jager
(74) *Attorney, Agent, or Firm* — NSIP Law

(57) ABSTRACT

A device includes a clock delay circuit configured to receive a reference clock signal and generate N delay clock signals, where N is a natural number greater than or equal to 2, by using the reference clock signal, and an output circuit configured to receive the N delay clock signals and output at least a portion of the delay clock signals from among the N delay clock signals as an output signal, wherein a phase delay of a delay clock signal that is output later in time from among the at least the portion of the delay clock signals is greater than or equal to a phase delay of a delay clock signal that is output earlier in time, and wherein a cycle of the output clock signal is longer than or equal to a cycle of the reference clock signal.

22 Claims, 7 Drawing Sheets

SPREAD SPECTRUM CLOCK GENERATION DEVICE AND METHOD FOR OPERATING SPREAD SPECTRUM CLOCK GENERATION DEVICE

CROSS-REFERENCE TO RELATED APPLICATIONS

This application claims the benefit under 35 U.S.C. § 119(a) of Korean Patent Application No. 10-2020-0003170 filed on Jan. 9, 2020 in the Korean Intellectual Property Office, the entire disclosure of which is incorporated herein by reference for all purposes.

BACKGROUND

1. Field

The following description relates to a spread spectrum clock generation device for generating a spread spectrum clock signal. The following description also relates to a method for operating a spread spectrum clock generation device for generating a spread spectrum clock signal.

2. Description of the Related Art

An electronic circuit may emit electromagnetic energy at a frequency of a clock signal, which may hinder the operations of other electronic devices. Such electromagnetic energy may be referred to as electromagnetic interference (EMI). Generally, the maximally permitted emission amount of the electromagnetic interference may be stipulated, beyond which unacceptable hinderance of other electronic devices may occur.

Recently, the requirement for high performance specifications by electronic devices may increase the area, the current consumption, and the usage frequency of such electronic devices, so that the emission amount of EMI also may tend to increase. A method for reducing such an emission amount of EMI may include a method for distributing the bandwidth of the frequency of the clock signal. Such a method may be referred to as "spread spectrum clocking."

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a device includes a clock delay circuit configured to receive a reference clock signal and generate N delay clock signals, where N is a natural number greater than or equal to 2, by using the reference clock signal, and an output circuit configured to receive the N delay clock signals and output at least a portion of the delay clock signals from among the N delay clock signals as an output signal, wherein a phase delay of a delay clock signal that is output later in time from among the at least the portion of the delay clock signals is greater than or equal to a phase delay of a delay clock signal that is output earlier in time, and wherein a cycle of the output clock signal is longer than or equal to a cycle of the reference clock signal.

The clock delay circuit may include N sub clock delay circuits connected in series.

The output circuit may be configured to output only delay clock signals with a phase delay greater than or equal to 0 and less than $2\pi$ from among the at least the portion of the delay clock signals.

In response to a delay clock signal to be output having a phase delay exceeding $2\pi$, the output circuit may be configured to output the reference clock signal instead of the delay clock signal to be output.

The device may further include a phase connection circuit configured to identify a delay clock signal having a phase delay exceeding $2\pi$ from among the N delay clock signals and generate a reference identifier in accordance with the identification result.

On the basis of the reference identifier, the output circuit may be configured to output only delay clock signals with a phase delay greater than or equal to 0 and less than $2\pi$ from among the at least the portion of the delay clock signals.

The output circuit may include a memory comprising a profile used for identifying the at least the portion of the delay clock signals, and an output module configured to select the at least the portion of the delay clock signals from among the N delay clock signals by using identifiers included in the profile.

The output module may be configured to generate a count value, read an identifier corresponding to the count value by using the profile, and select the at least the portion of the delay clock signals by using the identifier.

The device may further include a compensation circuit configured to generate a compensation value such that the output clock signal corresponds to the reference clock signal, in response to the cycle of the output clock signal being less than the cycle of the reference clock signal.

In another general aspect, a device includes a clock delay circuit configured to receive a reference clock signal and generate N delay clock signals, where N is a natural number greater than or equal to 2, by delaying sequentially the reference clock signal, and an output circuit configured to receive the N delay clock signals, select a portion of the clock signals from among the N delay clock signals and the reference clock signal, and output the selected the portion of the clock signals as an output clock signal in the order of smallest to largest phase delay, wherein a cycle of the output clock signal is longer than or equal to a cycle of the reference clock signal.

The device may further include a phase connection circuit configured to detect phases of the N delay clock signals and generate a reference identifier for identifying a delay clock signal with a phase delay exceeding $2\pi$ from among the N delay clock signals.

On the basis of the reference identifier, the output circuit may output only clock signals with a phase delay greater than or equal to 0 and less than $2\pi$ from among the portion of the clock signals.

On the basis of the reference identifier, the output circuit may be configured to output a first clock signal having a small phase delay from among the reference clock signal or the portion of the clock signals, instead of a clock signal with a phase delay exceeding $2\pi$, from among the portion of the clock signals.

The device may further include a compensation circuit configured to generate a compensation value such that the output clock signal corresponds to the reference clock signal, in response to the cycle of the output clock signal being less than the cycle of the reference clock signal.

In another general aspect, a method includes receiving a reference clock signal, generating N delay clock signals, where N is a natural number greater than or equal to 2, by using the reference clock signal, and outputting sequentially at least a portion of the delay clock signals from among the N delay clock signals as an output signal, wherein a phase delay of a delay clock signal that is output later in time among the at least the portion of the delay clock signals is greater than or equal to a phase delay of a delay clock signal that is output earlier in time, and wherein a cycle of the output clock signal is longer than or equal to a cycle of the reference clock signal.

The sequentially outputting may include outputting only delay clock signals with a phase delay greater than or equal to 0 and less than $2\pi$, from among the at least the portion of the delay clock signals.

The sequentially outputting may include identifying an excess phase delay clock signal with a phase delay exceeding $2\pi$ from among the at least the portion of the delay clock signals; and outputting a minimum phase delay clock signal having a minimum phase delay from among the reference clock signal and the at least the portion of the delay clock signals, instead of the excess phase delay clock signal.

The sequentially outputting may include generating a count value in accordance with a cycle, and outputting sequentially a delay clock signal corresponding to the count value from among the at least the portion of the delay clock signals.

In another general aspect, a method includes receiving a reference clock signal, generating N delay clock signals, where N is a natural number greater than or equal to 2, by delaying sequentially the reference clock signal, receiving the N delay clock signals, selecting a portion of the clock signals from among the N delay clock signals and the reference clock signal; and outputting the portion of the clock signals as an output clock signal in the order of smallest to largest phase delay, wherein a cycle of the output clock signal is longer than or equal to a cycle of the reference clock signal.

The method may further include detecting phases of the N delay clock signals and generate a reference identifier for identifying a delay clock signal with a phase delay exceeding $2\pi$ from among the N delay clock signals.

The method of may further include, on the basis of the reference identifier, outputting a first clock signal having a small phase delay from among the reference clock signal or the portion of the clock signals, instead of a clock signal with a phase delay exceeding $2\pi$, from among the portion of the clock signals.

The method may further include generating a compensation value, such that the output clock signal corresponds to the reference clock signal, in response to the cycle of the output clock signal being less than the cycle of the reference clock signal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
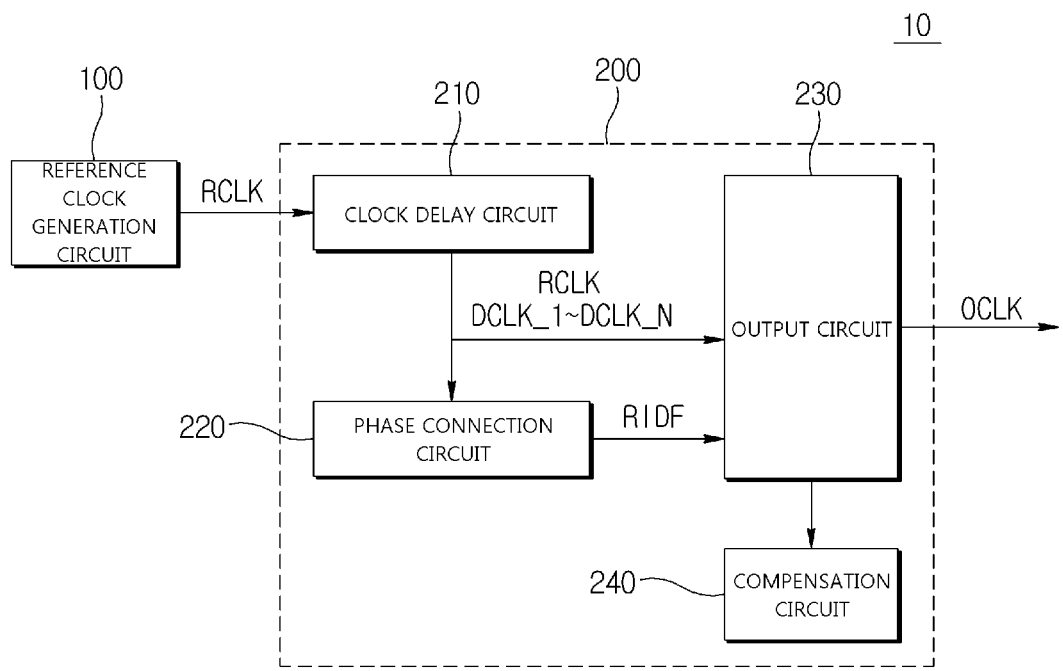
FIG. 1 shows a spread spectrum clock generation system according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below"

or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

One purpose of the present one or more embodiments is to provide a spread spectrum clock generation device for generating a spread spectrum clock signal and a method for operating such a spread spectrum clock generation device.

FIG. 1 shows a spread spectrum clock generation system according to one or more embodiments. Referring to FIG. 1, the spread spectrum clock generation system 10 may generate a reference clock signal RCLK, and also an output clock signal OCLK that has a frequency spectrum wider than that of the reference clock signal RCLK, on the basis of the reference clock signal RCLK.

The spread spectrum clock generation system 10 may include a reference clock generation circuit 100 and a spread spectrum clock generation device 200, according to a non-limiting example.

The reference clock generation circuit 100 may generate the reference clock signal RCLK. According to one or more embodiments, the reference clock generation circuit 100 may generate the reference clock signal RCLK having a constant cycle. For example, the reference clock generation circuit 100 may be an oscillator, a crystal oscillator or a COMS oscillator, and may not be limited to such one or more enumerated example embodiments.

The spread spectrum clock generation device 200 may receive the reference clock signal RCLK and may, on the basis of the reference clock signal RCLK, generate the output clock signal OCLK that has a frequency spectrum wider than that of the reference clock signal RCLK. That is, the frequency of the output clock signal OCLK may be uniformly distributed over an area wider than that of the frequency of the reference clock signal RCLK. Also, the cycle of the output clock signal OCLK may be longer than or equal to that of the reference clock signal RCLK. In this disclosure, the cycle of the output clock signal OCLK may mean a period of time from any rising or falling edge of the output clock signal OCLK to the next rising or falling edge of the output clock signal OCLK.

Therefore, because the spread spectrum clock generation device 200 may have a frequency spectrum wider than that of the reference clock signal RCLK or may have a cycle longer than that of the reference clock signal RCLK, there may be a resultant effect of reducing electromagnetic interference generated in an electronic device or in an electronic system, in which the spread spectrum clock generation device 200 may be used or mounted. Subsequently, this phenomenon is described in greater detail.

The spread spectrum clock generation device 200 may include a clock delay circuit 210, a phase connection circuit 220, an output circuit 230, and a compensation circuit 240, according to one or more non-limiting examples, as illustrated in FIG. 1.

The clock delay circuit 210 may receive the reference clock signal RCLK and may generate N delay clock signals DCLK_1 to DCLK_N, on the basis of the reference clock signal RCLK. Here, N is a natural number greater than or equal to 2. According to one or more embodiments, the clock delay circuit 210 may generate N delay clock signals DCLK_1 to DCLK_N, by delaying the reference clock signal RCLK. For example, each of the delay clock signals DCLK_1 to DCLK_N may have a phase delay, where the phase delay is greater than or equal to 0 and less than $2\pi$, with respect to the reference clock signal RCLK. The phase delays that the respective delay clock signals DCLK_1 to DCLK_N have may be different from each other, and are not limited to these enumerated example delays.

The clock delay circuit 210 may be implemented by using a phase locked loop (PLL), a delayed locked loop (DLL), or a digitally controlled delay line (DCDL), and the clock delay circuit 210 is not limited to these enumerated examples of a clock delay circuit 210.

Also, the clock delay circuit 210 may output the reference clock signal RCLK.

The phase connection circuit 220 may receive the reference clock signal RCLK and the delay clock signals DCLK_1 to DCLK_N. According to one or more embodiments, the phase connection circuit 220 may receive the reference clock signal RCLK and the delay clock signals DCLK_1 to DCLK_N through a pad, a port, or a transmission line, as non-limiting examples, which correspond to the reference clock signal RCLK and the delay clock signals DCLK_1 to DCLK_N, respectively.

On the basis of the reference clock signal RCLK, the phase connection circuit 220 may detect the phase delay of each of the delay clock signals DCLK_1 to DCLK_N and may generate a corresponding phase delay value based on the detection result. For example, the phase connection circuit 220 may compare a time point of the rising edge or falling edge of the reference clock signal RCLK with a time point of the rising edge or falling edge of the delay clock signals DCLK_1 to DCLK_N. The phase connection circuit may then generate, based on the comparison result, the phase delay value for the reference clock signal RCLK of each of the delay clock signals DCLK_1 to DCLK_N.

On the basis of the phase delay value, the phase connection circuit 220 may identify a delay clock signal, for example, an excess phase delay clock signal, with a phase delay exceeding a value of $2\pi$ from among the delay clock signals DCLK_1 to DCLK_N, and may generate a reference identifier RIDF that may be used for identifying the excess phase delay clock signal in accordance with the identification result.

According to one or more embodiments, on the basis of the phase delay value, the phase connection circuit 220 may identify a delay clock signal, for example, the excess phase delay clock signal, with a phase delay exceeding $2\pi$ for the first time from among the delay clock signals DCLK_1 to DCLK_N. For example, the phase connection circuit 220 may identify a delay clock signal with a minimum phase delay from among the delay clock signals having a phase delay exceeding $2\pi$.

The output circuit 230 may generate the output clock signal OCLK by using the reference clock signal RCLK and the delay clock signals DCLK_1 to DCLK_N. According to one or more embodiments, the output circuit 230 may output at least a portion of the reference clock signal RCLK and the delay clock signals DCLK_1 to DCLK_N as the output clock signal OCLK.

According to one or more embodiments, the output circuit 230 may select and output the delay clock signals with a phase delay not exceeding $2\pi$ from among the delay clock signals DCLK_1 to DCLK_N. For example, the output circuit 230 may identify a delay clock signal, for example, the excess phase delay clock signal, with a phase delay exceeding $2\pi$ from among the delay clock signals DCLK_1 to DCLK_N, by using the reference identifier RIDF, and may output a delay clock signal having a phase delay less than that of the phase delay of the excess phase delay clock signal.

The compensation circuit 240 may generate a compensation value, according to the output clock signal OCLK. As described above, because the output clock signal OCLK may have a frequency spectrum wider than that of the reference clock signal RCLK, compensation may be required compared to an example in which the reference clock signal RCLK may be used as a system clock signal. That is, the compensation value may be a compensation value or an offset of the output clock signal OCLK, with respect to the reference clock signal RCLK.

It may be, for example, assumed that seven cycles of the reference clock signal RCLK are to be generated for a certain period of time and six cycles of the output clock signal OCLK are to be generated for the certain period of time. If a circuit generates a signal based on the seven cycles of the reference clock signal RCLK, the circuit is to accordingly generate the signal based on the six cycles of the output clock signal OCLK. Therefore, in order to compensate for such a difference between these clock signals, the compensation circuit 240 may generate a compensation value that indicates that the output clock signal OCLK includes one cycle less than those generated with respect to the reference clock signal RCLK for the certain period of time, and the compensation value may be 1, in that there is a difference of 1 between the quantity of cycles associated with the reference clock signal RCLK and the quantity of cycles associated with the output clock signal OCLK.

That is, the cycle of the output clock signal OCLK may be increased more than the reference clock signal RCLK by the use of the output clock signal OCLK, where the frequency spectrum is widened. Therefore, the number of clocks or rising edges may decrease for the same period of time, and thus may be compensated for through using the compensation circuit 240.

Figure 2:
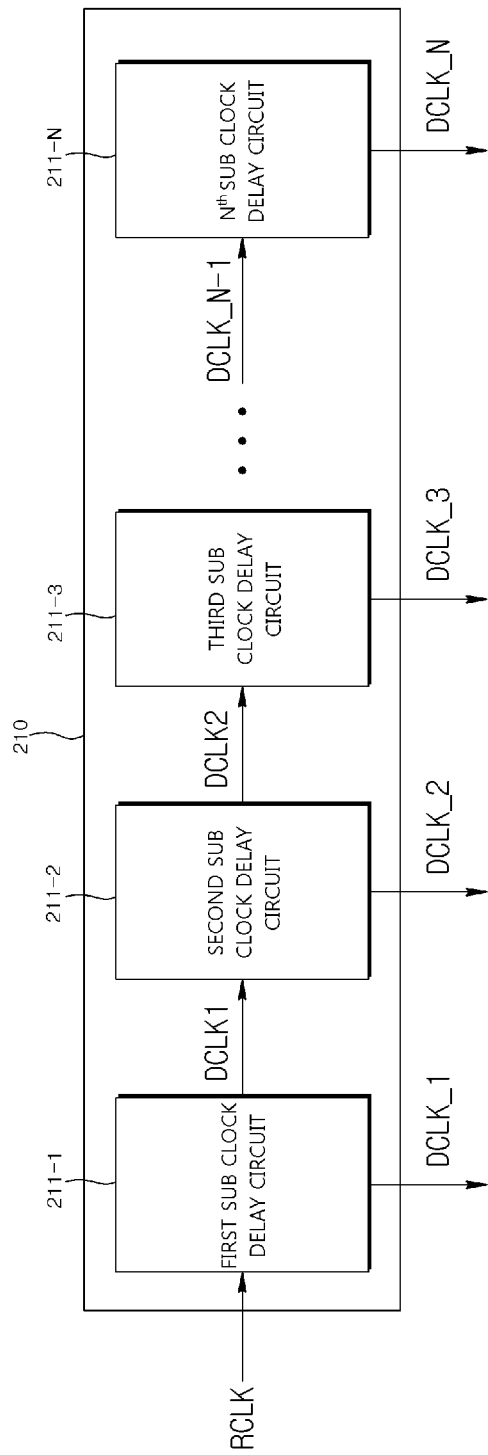
FIG. 2 shows a clock delay circuit according to one or more embodiments.

FIG. 2 shows the clock delay circuit according to one or more embodiments. Referring to FIGS. 1 and 2, the clock delay circuit 210 may include a plurality of sub clock delay circuits 211-1 to 211-N. Although N sub clock delay circuits 211-1 to 211-N are shown in FIG. 2, one or more embodiments are not limited to the particular number of the sub clock delay circuits 211-1 to 211-N illustrated in FIG. 2.

The sub clock delay circuits 211-1 to 211-N may generate N delay clock signals DCLK_1 to DCLK_N, such as by using the reference clock signal RCLK. According to one or more embodiments, the sub clock delay circuits 211-1 to 211-N may be connected in series. Accordingly, a delay clock signal generated later in time may have a larger phase delay than a delay clock signal that was generated earlier in time. Subsequently, in this disclosure, the fact that a delay clock signal is generated "relatively earlier" with respect to another clock signal is used to mean that the delay clock signal may have a "relatively small" phase delay.

The first sub clock delay circuit 211-1 may generate the first delay clock signal DCLK_1 by delaying the reference clock signal RCLK by a phase delay Td, and the second sub clock delay circuit 211-2 may generate the second delay clock signal DCLK_2 by delaying the first delay clock signal DCLK_1. In a similar way, the $N^{th}$ sub clock delay circuit 211-N may generate the $N^{th}$ delay clock signal DCLK_N by delaying the N–$1^{th}$ delay clock signal DCLK_N–1.

Figure 3:
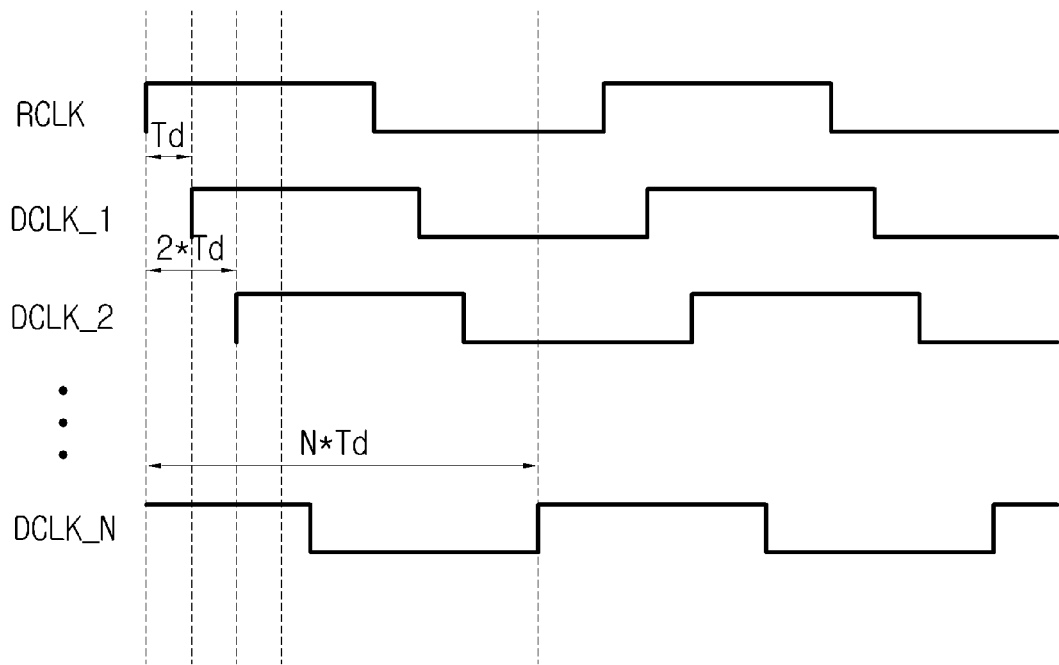
FIG. 3 shows a reference clock signal and a delay clock signal according to one or more embodiments.

FIG. 3 shows the reference clock signal and the delay clock signal according to the one or more embodiments. Referring to FIGS. 1 to 3, the reference clock signals RCLK and N delay clock signals DCLK_1 to DCLK_N may be shown.

Each of the delay clock signals DCLK_1 to DCLK_N may have a phase delay with respect to the reference clock signal RCLK. According to one or more embodiments, the delay clock signals DCLK_1 to DCLK_N may have an increasing phase delay. For example, the first delay clock signal DCLK_1 may have the reference clock signal RCLK and the phase delay Td, and the second delay clock signal DCLK_2 may have the reference clock signal RCLK and a phase delay 2*Td. Similarly, the $N^{th}$ delay clock signal DCLK_N may accordingly have a phase delay N*Td.

However, the phase delay shown in FIG. 3, with respect to the reference clock signal RCLK of the delay clock signals DCLK_1 to DCLK_N is just a non-limiting example. One or more embodiments are not limited to such an example.

Figure 4:
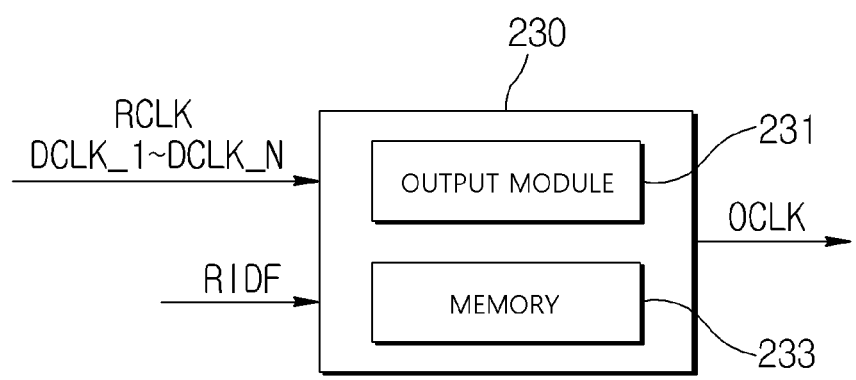
FIG. 4 shows an output circuit according to one or more embodiments.

FIG. 4 shows the output circuit according to one or more embodiments. Referring to FIGS. 1 to 4, the output circuit 230 may include an output module 231 and a memory 233.

Subsequently, a module mentioned in this disclosure refers to hardware capable of performing at least one designated function or refers to hardware including software instructions that cause the hardware to perform the designated function. That is, a specific module described in this disclosure may refer to a device or a circuit that is capable of performing a corresponding function, or may mean a hardware device on which software instructions causing the device to be capable of performing the function is executed.

The output module 231 may control the overall operation of the output circuit 230. According to one or more embodiments, the output module 231 may select at least a portion of the clock signals from among the reference clock signal RCLK and the delay clock signals DCLK_1 to DCLK_N, and may output the selected at least a portion of the clock signals as the output clock signal OCLK.

According to one or more embodiments, the output module 231 may include any one or any combination of any two or more of a central processing unit (CPU), a micro controller unit (MCU), a micro-processor unit (MPU), a floating point unit (FPU), a digital signal processor (DSP), a programmable logic circuit, a field-programmable gate array (FPGA) or a programmable logic array (PLA). However, the output module 231 is not limited to these non-limiting examples of types of hardware used to implement the output module 231.

The output module 231 may select one of the reference clock signal RCLK and the delay clock signals DCLK_1 to DCLK_N, and may output the selected one clock signal as the output clock signal OCLK. By repeating this selection process, the output module 231 may output at least a portion of the clock signals of the reference clock signal RCLK and the delay clock signals DCLK_1 to DCLK_N as the output clock signal OCLK. According to one or more embodiments, the output circuit 230 may output the at least a portion of the clock signals in the order in which the phase delay is increased, that is, in order of smallest phase delay, so that the output clock signal OCLK may be output accordingly.

In the present disclosure, the order in which the phase delay is increased means that the phase delay of the output clock signals is increased or maintained with respect to how the output clock signals are ordered. That is, for at least a portion of the clock signals that are output as the output clock signal OCLK, the phase delay of a first clock signal may be less than or equal to the phase delay of a second clock signal that is output after the first clock signal.

For example, the output module 231 may output, sequentially, the first clock signal for example, a minimum phase delay clock signal, the second clock signal, . . . , a $k^{th}$ clock signal, where k is a natural number equal to or less than N+1, in the order of small phase delay, among the at least a portion of the clock signals. In such an example, a period of time for which the first clock signal to the $k^{th}$ clock signal are output may be referred to as a spread cycle. For example, the first clock signal may be the reference clock signal RCLK, but the first clock signal is not limited to such a particular non-limiting example.

The output module 231 may repeatedly output the at least a portion of the clock signals, according to the spread cycle. That is, the first clock signal to the $k^{th}$ clock signal may be output, from among the at least a portion of the clock signals, by the output module 231, and then the first clock signal may be output, from the beginning, again. The output module 231 may repeat such a sequence.

According to one or more embodiments, the output module 231 may generate a count value and may select and output a clock signal, corresponding to the count value, from among the reference clock signal RCLK and the delay clock signals DCLK_1 to DCLK_N. Further, the output module 231 may output a delay clock signal having a maximum phase delay from among the at least a portion of the clock signals, and then may initialize the count value and may output the reference clock signal RCLK.

According to one or more embodiments, the output module 231 may read a profile stored in the memory 233, and may then select at least a portion of the clock signals from among the reference clock signal RCLK and the delay clock signals DCLK_1 to DCLK_N by using the profile and the count value.

The profile stored in the memory 233 may store identifiers that are mapped to the count value. According to one or more embodiments, the profile may be a look-up table (LUT).

The output module 231 may read the identifier corresponding to the count value with reference to the profile, and may select at least a portion of the clock signals from among the reference clock signal RCLK and the delay clock signals DCLK_1 to DCLK_N by using the identifier.

For example, the output module 231 may select at least a portion of the clock signals in advance.

The identifier may indicate which delay clock signal the corresponding delay clock signal is. That is, the identifier may indicate which sub clock delay circuit the corresponding delay clock signal is generated from. For example, when the identifier is larger, a delay clock signal that is generated later may be indicated.

According to one or more embodiments, the profile stored in the memory 233 may define a function that may have the count value as an input and may have a corresponding identifier as an output. That is, the profile may indicate clock signals to be output by the output circuit 230, from among the reference clock signal RCLK and N delay clock signals DCLK_1 to DCLK_N, and may indicate their output order.

In such an example, the function may be an identity function or may be an increasing function. For example, if a first count value is greater than a second count value, the phase delay of the clock signal identified by a first identifier corresponding to the first count value may be more than the phase delay of the clock signal identified by a second identifier corresponding to the second count value.

In addition, the identifier corresponding to the count value may vary, depending on the profile. For example, according to a first profile, the identifier corresponding to the count value "1" may indicate using the first delay clock signal DCLK_1. Meanwhile, according to a second profile, the identifier corresponding to the count value "1" may indicate using the second delayed clock signal DCLK_2.

Based on the reference identifier RIDF, the output module 231 may output clock signals having a phase delay greater than or equal to 0 and a phase delay less than $2\pi$ from among the selected at least a portion of the clock signals. For example, as described later, when the phase delay of the clock signal to be output at the $k^{th}$ time exceeds $2\pi$, the output circuit 230 may output the first clock signal, that is, the reference clock signal or the clock signal having a small phase delay from among the selected at least a portion of the clock signals, instead of the clock signal to be output at the $k^{th}$ time.

According to one or more embodiments, the output module 231 may read identifiers indicating a clock signal having a phase delay smaller than that of a clock signal identified by the reference identifier RIDF, from among the identifiers included in the profile, and may select at least a portion of the clock signals on the basis of the read identifier.

The memory 233 may store data required for the operation of the output circuit 230. According to one or more embodiments, the memory 233 may store a clock profile. For example, the memory 233 may include a non-volatile memory and/or a volatile memory.

Figure 5:
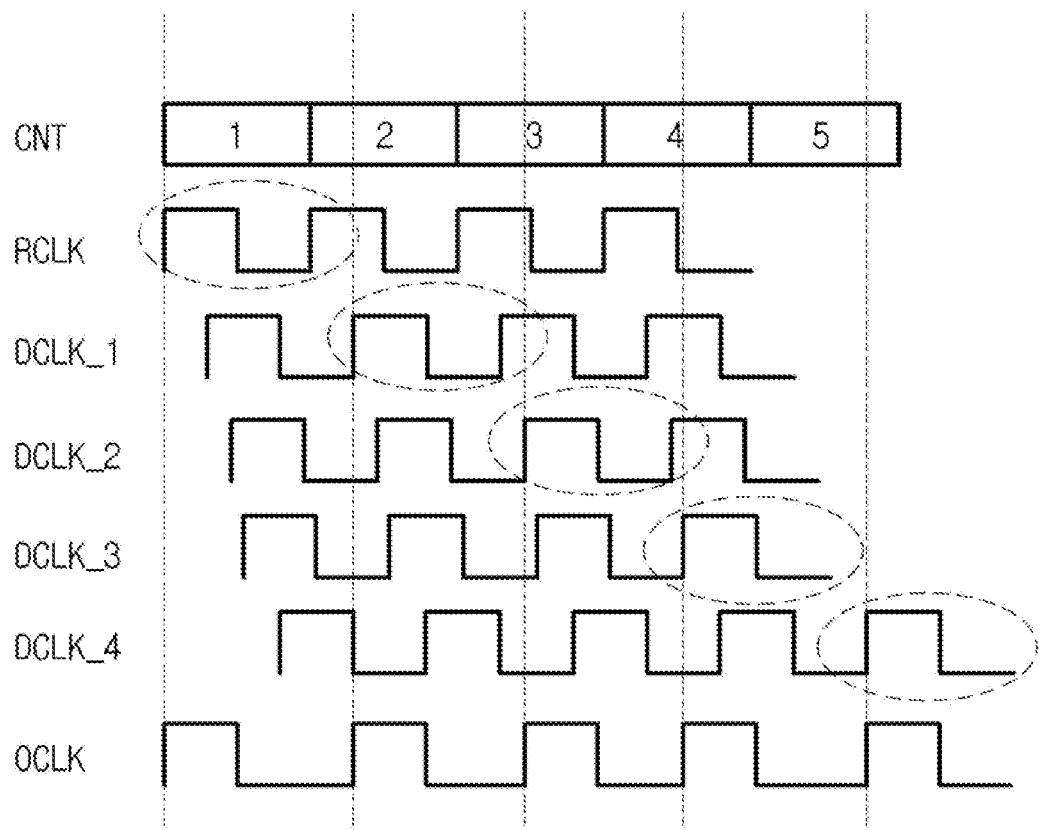
FIGS. 5 and 6 are views for describing the operation of an output module according to one or more embodiments.
Figure 6:
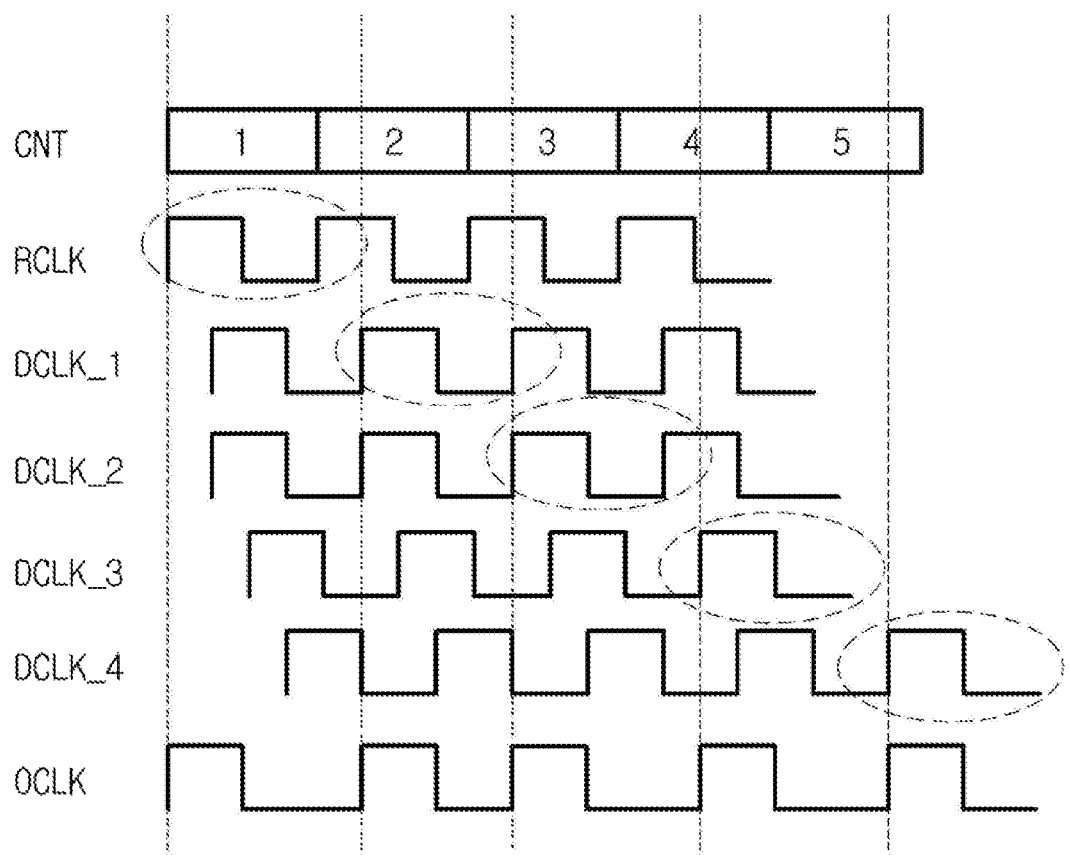

FIGS. 5 and 6 are views for describing the operation of an output module according to one or more embodiments. Referring to FIGS. 1 to 6, the output module 231 may output at least a portion of the clock signals from among the reference clock signal RCLK and the delay clock signals DCLK_1 to DCLK_N as the output clock signal OCLK.

The output module 231 may generate a count value, such as CNT=1, during a first cycle of the reference clock signal RCLK, and may output the reference clock signal RCLK according to the generated count value, such as CNT=1, as an output clock signal OCLK. According to one or more embodiments, the output module 231 may read an identifier corresponding to the count value, such as CNT=1, by using the stored profile, may select the reference clock signal RCLK by using the identifier, and may accordingly output the reference clock signal RCLK as the output clock signal OCLK.

Similarly, the output module 231 may generate a count value, such as CNT=2, during a second cycle of the reference clock signal RCLK, and may output the first delay clock signal DCLK_1 according to the generated count value, such as CNT=2, as an output clock signal OCLK. The output module 231 may generate a count value, such as CNT=3, in a third cycle of the reference clock signal RCLK, and may output the second delay clock signal DCLK_2 according to the generated count value, such as CNT=3, as an output clock signal OCLK. The output module 231 may generate a count value, such as CNT=4, in a fourth cycle of the reference clock signal RCLK, and may output the third delay clock signal DCLK_3 according to the generated count value, such as CNT=4, as an output clock signal OCLK. The output module 231 may generate a count value, such as CNT=5, in a fifth cycle of the reference clock signal RCLK, and may output the fourth delay clock signal DCLK_4 according to the generated count value, such as CNT=5, as an output clock signal OCLK.

Meanwhile, the output module 231 may generate the count value CNT, in response to the reference clock signal RCLK, as a non-limiting example, but is not limited to this particular example. For example, the output module 231 may generate the count value CNT in response to the delay clock signal that was output immediately before. That is, the first count value, such as CNT=1, may be generated in response to the reference clock signal RCLK, and the second count value, such as CNT=2, may be generated in response to the first delay clock signal DCLK_1.

Not only the delay clock signals DCLK_1 to DCLK_N may have a phase delay with respect to the reference clock signal RCLK, but also the delay clock signal generated later may have a phase delay greater than or equal to the phase delay of the delay clock signal that was generated before. Accordingly, the cycle of the output clock signal OCLK may be longer than or equal to that of the reference clock signal RCLK. As a result, electromagnetic interference may be reduced, accordingly.

As shown in FIGS. 5 and 6, the spread spectrum clock generation device 200 may generate at least a portion of the delay clock signals DCLK_1 to DLCK_4 from among the plurality of delay clock signals DCLK_1 to DCLK_N, and may also output the at least a portion of the delay clock signals DCLK_1 to DLCK_4 as an output clock signal OCLK.

According to one or more embodiments, the delay clock signals DCLK_1 to DLCK_4 in FIG. 5 may be presented in the order in which the phase delay is increased. That is, the phase delay of the first delay clock signal DLCK_1 may be less than the phase delay of the second delay clock signal DLCK_2, and the phase delay of the second delay clock signal DLCK_2 may be less than the third delay clock signal DLCK_3. Finally, in such an example, the phase delay of the third delay clock signal DLCK_3 may be less than the phase delay of the fourth delay clock signal DLCK_4. Accordingly, a timing margin of the output clock signal OCLK may be improved by operating in this manner.

According to one or more embodiments, the delay clock signals DCLK_1 to DLCK_4 in FIG. 6 may be sequenced in the order in which the phase delay is maintained or increased. That is, in a non-limiting example, the phase delay of the first delay clock signal DLCK_1 may be equal to the phase delay of the second delay clock signal DLCK_2, and the phase delay of the second delay clock signal DLCK_2 may be less than the phase delay of the third delay clock signal DLCK_3. The phase delay of the third delay clock signal DLCK_3 may be less than the phase delay of the fourth delay clock signal DLCK_4. Accordingly, a timing margin of the output clock signal OCLK may be improved by managing phase delays using such an approach.

Meanwhile, although FIGS. 5 and 6 show that the reference clock signal RCLK and the four delay clock signals DCLK_1 to DCLK_4 may be output by the output module 231, such an approach is just a non-limiting example. The output module 231 may output all or some of the clock signals, from among the reference clock signal RCLK and N delay clock signals DCLK_1 to DCLK_N.

Also, the output module 231 may output all of the portion of the of the clock signals, and then may subsequently output a portion of the clock signals again, from the beginning.

Figure 7:
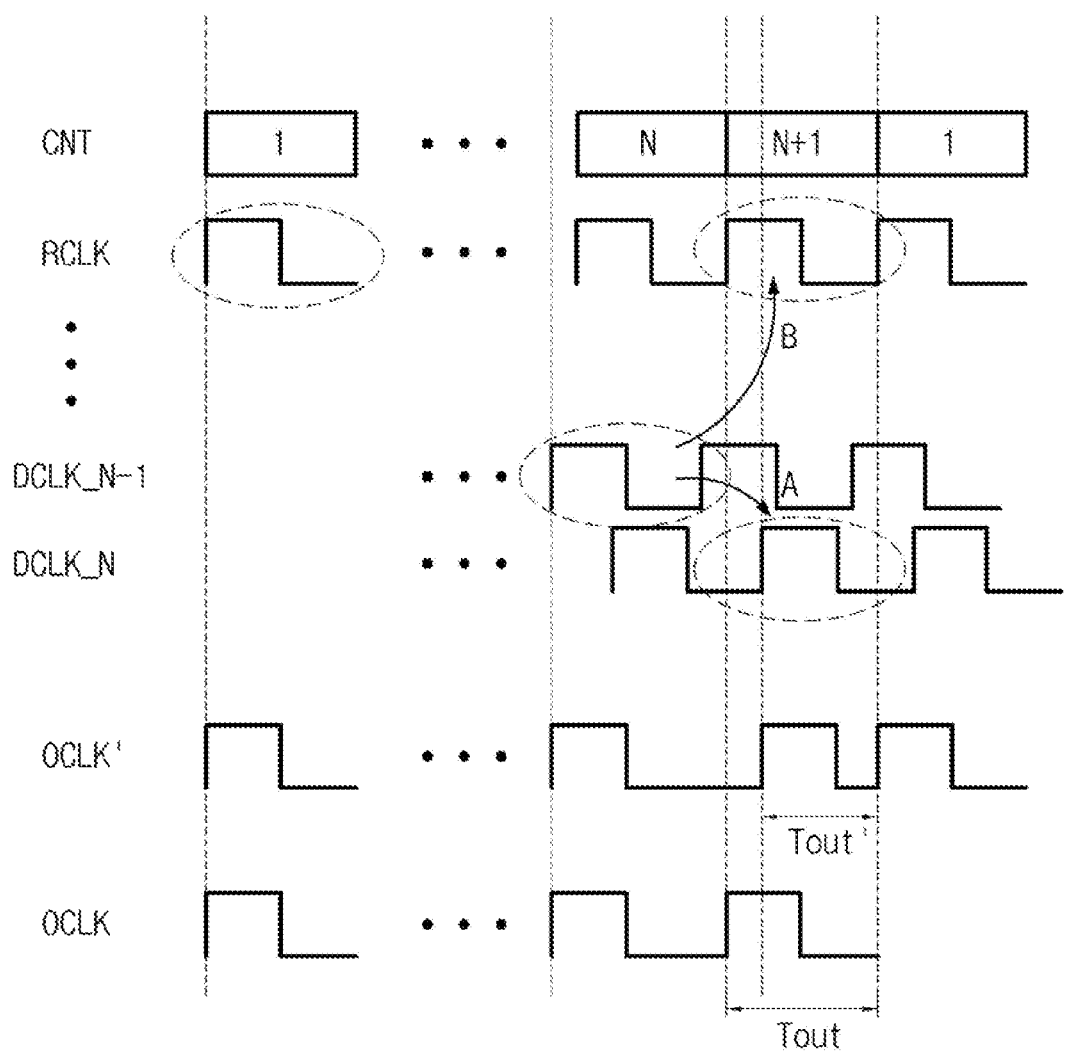
FIG. 7 shows the operation of a phase connection circuit according to one or more embodiments.

FIG. 7 shows the operation of the phase connection circuit according to one or more embodiments. According to FIG. 7, the cycle Tout of the output clock signal OCLK may be longer than or equal to the cycle of the reference clock signal RCLK.

Referring to FIGS. 1 to 7, it may be assumed that the phase delay of the N−$1^{th}$ delay clock signal DCLK_N−1 with respect to the reference clock signal RCLK may be less than $2\pi$ and the phase delay of the $N^{th}$ delay clock signal DCLK_N with respect to the reference clock signal RCLK may exceed $2\pi$.

In such an example, because the phase delay of the $N^{th}$ delay clock signal DCLK_N exceeds $2\pi$, when the $N^{th}$ delay clock signal DCLK_N is output and the reference clock signal RCLK is output, as shown at A, the cycle Tout' of the output clock signal OCLK' may become shorter than the cycle of the reference clock signal RCLK, so that timing margin may be reduced, accordingly.

According to one or more embodiments, on the basis of the phase delay, the phase connection circuit 220 may identify a delay clock signal having a phase delay exceeding $2\pi$, from among the delay clock signals DCLK_1 to DCLK_N and may generate the reference identifier RIDF for identifying the delay clock signal with a phase delay exceeding $2\pi$, in accordance with the identification result.

The output module 231 may identify a delay clock signal having a phase delay exceeding $2\pi$ by using the reference identifier RIDF. The output module 231 may determine that the phase delay of the $N^{th}$ delay clock signal DCLK_N exceeds $2\pi$, also by using the reference identifier RIDF. According to one or more embodiments, before the $N^{th}$ delay clock signal DCLK_N is output, the output module 231 may determine that the phase delay of the $N^{th}$ delay clock signal DCLK_N scheduled to be output exceeds $2\pi$, also by using the reference identifier RIDF.

According to the result of the determination, the output module 231 may output a clock signal having a phase delay less than $2\pi$, instead of outputting the $N^{th}$ delay clock signal DCLK_N. For example, the output module 231 may output, as shown at B, any one delay clock signal selected from the reference clock signal RCLK and the first delay clock signal DCLK_1 to the N−$1^{th}$ delay clock signal DCLK_N−1.

Accordingly, the cycle Tout of the output clock signal OCLK may become longer than or equal to the cycle of the reference clock signal RCLK, and as a result, a problem that the timing margin decreases may therefore be solved.

That is, the phase connection circuit 220 according to one or more may generate the reference identifier RIDF used for identifying the delay clock signal having a phase delay exceeding $2\pi$ from among the delay clock signals DCLK_1 to DCLK_N. In addition, on the basis of the reference identifier, the output circuit 230 may output only clock signals having a phase delay greater than or equal to 0 and less than 2π from among the delay clock signals DCLK_1 to DCLK_N, in the order in which the phase delay is increased, and may then be initialized to output the reference clock signal RCLK or the delay clock signal having a phase delay greater than or equal to 0 and less than 2π. Therefore, the cycle Tout of the output clock signal OCLK may become longer than or equal to that of the reference clock signal RCLK, so that electromagnetic interference may be reduced and a timing margin may be improved.

Figure 8:
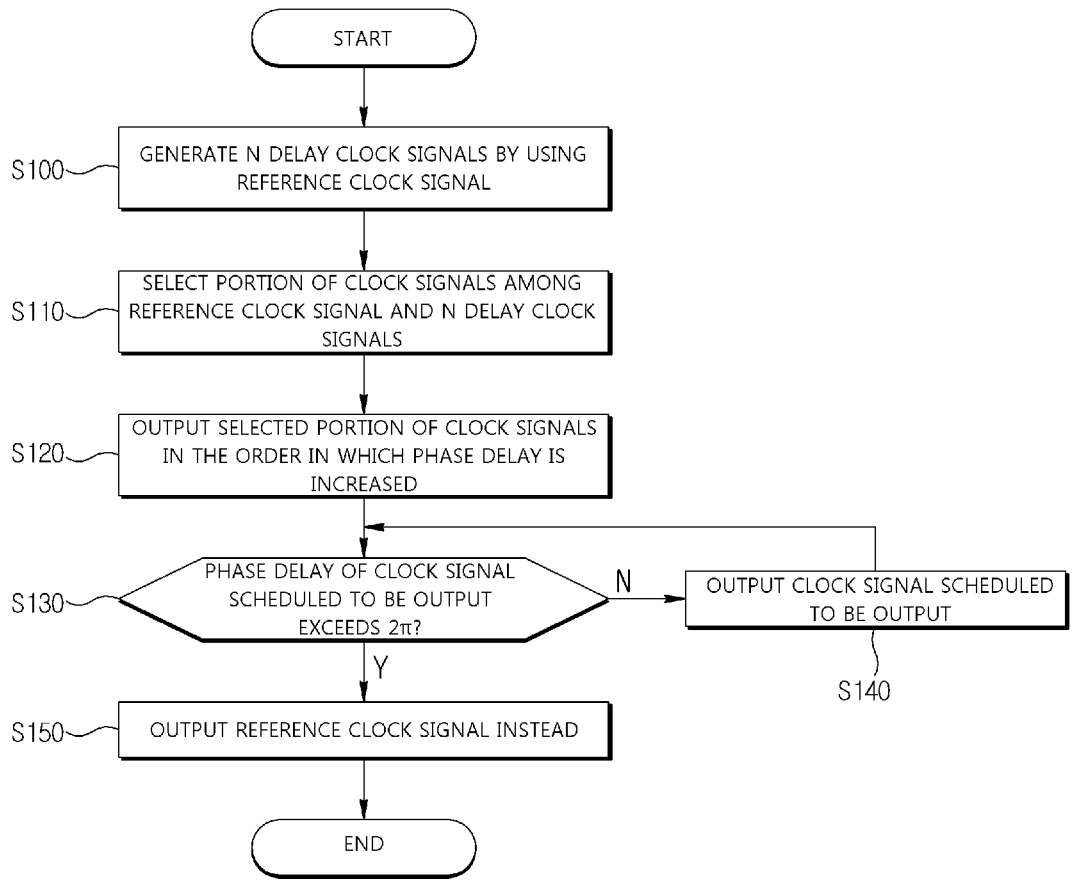
FIG. 8 is a flowchart showing an operation method of a spread spectrum clock generation circuit according to one or more embodiments.

FIG. 8 is a flowchart showing an operation method of a spread spectrum clock generation circuit according to one or more embodiments. Referring to FIGS. 1 to 8, the spread spectrum clock generation device 200 may generate N delay clock signals DCLK_1 to DCLK_N by using the reference clock signal RCLK in operation S100.

The spread spectrum clock generation device 200 may select a portion of the clock signals from among the reference clock signal RCLK and the N delay clock signals DCLK_1 to DCLK_N in operation S110.

The spread spectrum clock generation device 200 may output the selected a portion of the clock signals in the order in which the phase delay is increased in operation S120.

The spread spectrum clock generation device 200 may determine whether the phase delay of a clock signal currently scheduled to be output among the selected a portion of the clock signals exceeds 2π in operation S130. According to one or more embodiments, on the basis of the profile stored in the memory 233 and the reference identifier RIDF transmitted from the phase connection circuit 220, the spread spectrum clock generation device 200 may determine whether the phase delay of a clock signal currently scheduled to be output exceeds 2π.

When the phase delay of the clock signal currently scheduled to be output does not exceed 2π, identified as option N in operation S130, the spread spectrum clock generation device 200 may output the clock signal scheduled to be output in operation S140.

When the phase delay of the clock signal currently scheduled to be output exceeds 2π, identified as option Y of S130, the spread spectrum clock generation device 200 may output the reference clock signal RCLK or the delay clock signal having a phase delay greater than or equal to 0 and less than 2π, instead of the clock signal scheduled to be output in operation S150.

The spread spectrum clock generation device according to one or more embodiments may be implemented using computer software instructions that are stored in a computer-readable storage medium and executed by the processor.

Directly and/or indirectly, and regardless of whether the storage media is in a raw state, in a formatted state, an organized state, or in any other accessible state, the storage media may include a relational database, a non-relational database, an in-memory database, and a database which can store a data and include a distributed type database, such as other suitable databases that allow access to the data through a storage controller. In addition, the storage medium may include any one or any combination of any two or more of a primary storage device, a secondary storage device, a tertiary storage device, an offline storage device, a volatile storage device, a nonvolatile storage device, a semiconductor storage device, a magnetic storage device, an optical storage device, and a flash storage devices, a hard disk drive storage device, a floppy disk drive, a magnetic tape, or any type of storage device such as other suitable data storage medium, and the storage device is not limited to these enumerated examples.

In this specification, the software instructions may be any one of or any two or more of assembler instructions, instruction-set-architecture (ISA) instructions, machine instructions, machine-dependent instructions, microcode, firmware instructions, state setting data, and source codes or object codes written in any combination of any one or more programming languages including an object-oriented programming language such as Smalltalk, C++, etc., and a conventional procedural programming language such as a C programming language or similar programming languages, though these are only non-limiting examples and other programming languages may be used.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A device, comprising:
   a clock delay circuit configured to receive a reference clock signal and generate N delay clock signals, where N is a natural number greater than or equal to 2, by using the reference clock signal; and
   an output circuit configured to receive the N delay clock signals and output at least a portion of the delay clock signals from among the N delay clock signals as an output clock signal,
   wherein a phase delay of a delay clock signal that is output later in time from among the at least the portion of the delay clock signals is greater than or equal to a phase delay of a delay clock signal that is output earlier in time, and
   wherein the output circuit is configured to generate the output clock signal having a cycle equal to or longer than a cycle of the reference clock signal, such that none of cycles of the output clock signal is shorter than the cycle of the reference clock signal.

2. The device of claim 1, wherein the clock delay circuit comprises N sub clock delay circuits connected in series.

3. The device of claim 1, wherein the output circuit is configured to output only delay clock signals with a phase delay greater than or equal to 0 and less than 2π from among the at least the portion of the delay clock signals.

4. The device of claim 3, wherein, in response to a delay clock signal to be output having a phase delay exceeding 2π, the output circuit is configured to output the reference clock signal instead of the delay clock signal to be output.

5. The device of claim 1, further comprising a phase connection circuit configured to identify a delay clock signal having a phase delay exceeding 2π from among the N delay clock signals and generate a reference identifier in accordance with the identification result.

6. The device of claim 5, wherein, on the basis of the reference identifier, the output circuit is configured to output only delay clock signals with a phase delay greater than or equal to 0 and less than $2\pi$ from among the at least the portion of the delay clock signals.

7. The device of claim 1, wherein the output circuit comprises:
a memory comprising a profile used for identifying the at least the portion of the delay clock signals; and
an output module configured to select the at least the portion of the delay clock signals from among the N delay clock signals by using identifiers included in the profile.

8. The device of claim 7, wherein the output module is configured to generate a count value, read an identifier corresponding to the count value by using the profile, and select the at least the portion of the delay clock signals by using the identifier.

9. The device of claim 1, further comprising a compensation circuit configured to generate a compensation value such that the output clock signal corresponds to the reference clock signal, in response to the cycle of the output clock signal being less than the cycle of the reference clock signal.

10. A device, comprising:
a clock delay circuit configured to receive a reference clock signal and generate N delay clock signals, where N is a natural number greater than or equal to 2, by delaying sequentially the reference clock signal; and
an output circuit configured to receive the N delay clock signals, select a portion of the clock signals from among the N delay clock signals and the reference clock signal, and output the selected portion of the clock signals as an output clock signal in the order of smallest to largest phase delay,
wherein the output circuit is configured to generate the output clock signal having a cycle equal to or longer than a cycle of the reference clock signal, such that none of cycles of the output clock signal is shorter than the cycle of the reference clock signal.

11. The device of claim 10, further comprising a phase connection circuit configured to detect phases of the N delay clock signals and generate a reference identifier for identifying a delay clock signal with a phase delay exceeding $2\pi$ from among the N delay clock signals.

12. The device of claim 11, wherein, on the basis of the reference identifier, the output circuit outputs only clock signals with a phase delay greater than or equal to 0 and less than $2\pi$ from among the portion of the clock signals.

13. The device of claim 11, wherein, on the basis of the reference identifier, the output circuit is configured to output a first clock signal having a small phase delay from among the reference clock signal or the portion of the clock signals, instead of a clock signal with a phase delay exceeding $2\pi$, from among the portion of the clock signals.

14. The device of claim 10, further comprising a compensation circuit configured to generate a compensation value such that the output clock signal corresponds to the reference clock signal, in response to the cycle of the output clock signal being less than the cycle of the reference clock signal.

15. A method for generating a spread spectrum clock signal, the method comprising:
receiving a reference clock signal;
generating N delay clock signals, where N is a natural number greater than or equal to 2, by using the reference clock signal; and
outputting sequentially at least a portion of the delay clock signals from among the N delay clock signals as an output clock signal,
wherein a phase delay of a delay clock signal that is output later in time among the at least the portion of the delay clock signals is greater than or equal to a phase delay of a delay clock signal that is output earlier in time, and
wherein the sequentially outputting comprises outputting the output clock signal having a cycle equal to or longer than a cycle of the reference clock signal, such that none of cycles of the output clock signal is shorter than the cycle of the reference clock signal.

16. The method of claim 15, wherein the sequentially outputting comprises outputting only delay clock signals with a phase delay greater than or equal to 0 and less than $2\pi$, from among the at least the portion of the delay clock signals.

17. The method of claim 15, wherein the sequentially outputting comprises:
identifying an excess phase delay clock signal with a phase delay exceeding $2\pi$ from among the at least the portion of the delay clock signals; and
outputting a minimum phase delay clock signal having a minimum phase delay from among the reference clock signal and the at least the portion of the delay clock signals, instead of the excess phase delay clock signal.

18. The method of claim 15, wherein the sequentially outputting comprises:
generating a count value in accordance with a cycle; and
outputting sequentially a delay clock signal corresponding to the count value from among the at least the portion of the delay clock signals.

19. A method for generating a spread spectrum clock signal, the method comprising:
receiving a reference clock signal;
generating N delay clock signals, where N is a natural number greater than or equal to 2, by delaying sequentially the reference clock signal;
receiving the N delay clock signals;
selecting a portion of the clock signals from among the N delay clock signals and the reference clock signal;
outputting sequentially the portion of the clock signals as an output clock signal in the order of smallest to largest phase delay,
wherein the sequentially outputting comprises outputting the output clock signal having a cycle equal to or longer than a cycle of the reference clock signal, such that none of cycles of the output clock signal is shorter than the cycle of the reference clock signal.

20. The method of claim 19, further comprising detecting phases of the N delay clock signals and generate a reference identifier for identifying a delay clock signal with a phase delay exceeding $2\pi$ from among the N delay clock signals.

21. The method of claim 20, further comprising, on the basis of the reference identifier, outputting a first clock signal having a small phase delay from among the reference clock signal or the portion of the clock signals, instead of a clock signal with a phase delay exceeding $2\pi$, from among the portion of the clock signals.

22. The method of claim 20, further comprising generating a compensation value, such that the output clock signal corresponds to the reference clock signal, in response to the cycle of the output clock signal being less than the cycle of the reference clock signal.

* * * * *